(12) United States Patent
Wright et al.

(10) Patent No.: US 8,081,481 B2
(45) Date of Patent: Dec. 20, 2011

(54) APPARATUS AND METHOD FOR A CLIP DEVICE FOR COUPLING A HEAT SINK PLATE SYSTEM WITH A BURN-IN BOARD SYSTEM

(75) Inventors: Nathan W Wright, Missouri City, TX (US); Ronnie R Schkade, Houston, TX (US); Noel T Gregorio, Baguio (PH); Richard J Karr, Rowlett, TX (US); Charles R Engle, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 12/482,942

(22) Filed: Jun. 11, 2009

(65) Prior Publication Data
US 2009/0244870 A1 Oct. 1, 2009

Related U.S. Application Data

(62) Division of application No. 11/102,060, filed on Apr. 8, 2005, now Pat. No. 7,561,433.

(60) Provisional application No. 60/560,879, filed on Apr. 9, 2004.

(51) Int. Cl.
*H05K 7/00* (2006.01)
*H05K 1/18* (2006.01)
*H05K 7/10* (2006.01)
*H01L 23/24* (2006.01)

(52) U.S. Cl. ......... 361/747; 361/769; 361/748; 257/718

(58) Field of Classification Search .................. 361/747, 361/769, 748; 257/718
See application file for complete search history.

(56) References Cited

U.S. PATENT DOCUMENTS

| | | | |
|---|---|---|---|
| 4,970,761 A | 11/1990 | Nakamura | |
| 5,648,893 A | 7/1997 | Loo et al. | |
| 5,919,050 A * | 7/1999 | Kehley et al. | 439/71 |
| 6,037,660 A | 3/2000 | Liu | |
| 6,104,614 A | 8/2000 | Chou et al. | |
| 6,246,584 B1 | 6/2001 | Lee et al. | |
| 6,304,452 B1 | 10/2001 | Lo | |
| 6,307,748 B1 | 10/2001 | Lin et al. | |
| 6,374,906 B1 | 4/2002 | Peterson et al. | |
| 6,392,889 B1 | 5/2002 | Lee et al. | |
| 6,473,305 B1 * | 10/2002 | Gordon et al. | 361/704 |

(Continued)

*Primary Examiner* — Bradley Thomas
(74) *Attorney, Agent, or Firm* — Mirna Abyad; Wade J. Brady, III; Frederick J. Telecky, Jr.

(57) ABSTRACT

A clip for coupling a first board and second board, the first board having plurality of first post coupled thereto, the second board having a plurality of second posts coupled thereto, each second post being a cylinder for receiving a first post, the first and second boards having a predetermined relative position when the second posts fully engage the first posts, each second post having an aperture in a side exposing the interior of the cylinder, each first post having a tapered end and a notch around the posts. The clip includes a base member, the base member being coupled to the second board, a top member, the top member having an aperture therein, and a side member connecting the top member and the base member, the side member fabricated so that an edge of the aperture is forced through the aperture into the interior of the second post, edge being forced into the notch when the first and the second posts are engaged and the first and second boards are in the predetermined relationship.

5 Claims, 3 Drawing Sheets

U.S. PATENT DOCUMENTS

| | | |
|---|---|---|
| 6,475,030 B1 | 11/2002 | Chang |
| 6,492,202 B1 * | 12/2002 | Lober et al. ............... 438/122 |
| 6,552,905 B2 | 4/2003 | Herring et al. |
| 6,741,089 B2 * | 5/2004 | Conroy ................. 324/755 |
| 6,795,317 B1 | 9/2004 | Liu |
| 6,829,143 B2 * | 12/2004 | Russell et al. ............ 361/704 |
| 6,865,083 B2 | 3/2005 | Liu |
| 6,934,155 B2 | 8/2005 | Aoki et al. |
| 6,950,310 B2 | 9/2005 | Edwards |
| 7,017,258 B2 | 3/2006 | Eckblad et al. |
| 7,109,979 B2 | 3/2006 | Wang et al. |
| 7,057,897 B2 * | 6/2006 | Leu ........................ 361/704 |
| 7,209,354 B2 * | 4/2007 | Wu et al. ................. 361/697 |
| 7,310,229 B2 | 12/2007 | Lee et al. |
| 7,345,880 B2 | 3/2008 | Lo |
| 7,349,218 B2 | 3/2008 | Lu et al. |
| 7,430,122 B2 | 9/2008 | Li |
| 7,589,521 B2 * | 9/2009 | Schubring et al. ........ 324/158.1 |
| 2005/0135064 A1 | 6/2005 | Chen et al. |
| 2005/0146343 A1 * | 7/2005 | Wright et al. ............ 324/760 |
| 2006/0094296 A1 | 5/2006 | Edwards et al. |
| 2006/0274503 A1 * | 12/2006 | Lee et al. ................. 361/704 |

* cited by examiner

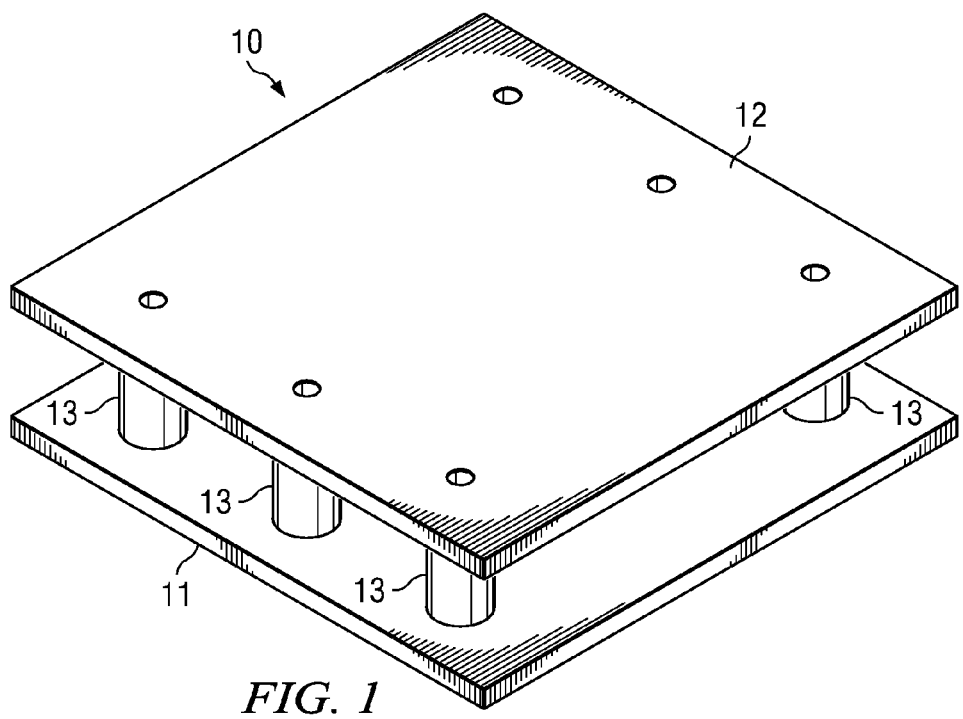
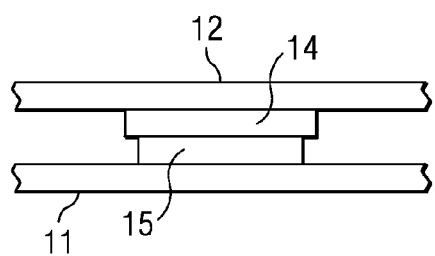
*FIG. 1*
(PRIOR ART)
*FIG. 1A*
(PRIOR ART)
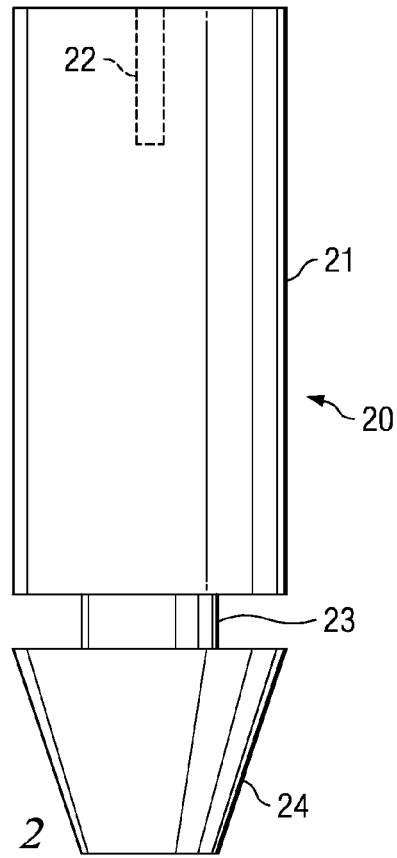
*FIG. 2*

APPARATUS AND METHOD FOR A CLIP DEVICE FOR COUPLING A HEAT SINK PLATE SYSTEM WITH A BURN-IN BOARD SYSTEM

This application is a divisional of U.S. patent application Ser. No. 11/102,060, filed Apr. 8, 2005, which claims priority from U.S. Provisional Application No. 60/560,879, filed Apr. 9, 2004, the entireties which are incorporated herein by reference.

BACKGROUND OF THE INVENTION

1. Field of the Invention

This invention relates generally to data processing systems and, more particularly, to the testing of the chips upon which the data processing circuits have been fabricated.

2. Background of the Invention

As the density of electronic components on a chip has increased, numerous associated problems have arisen. For example, as the density of circuits fabricated on the chip has increased, the problems associated with heat dissipation of the chip have similarly increased. The "burn-in" of a chip is meant to insure that possible incipient defects are caused to fail prior to the chip reaching a customer. To further complicate the "burn-in" testing of chips, the increased number of circuits being tested means that additional time is required for the test procedures. If a larger number of circuits are activated simultaneously, the increased heat generation can cause chip failure that is not related to the circuit fabrication.

"In U.S. Patent Application No. 60/560,879, an apparatus for cooling semiconductor chips during burn-in is disclosed."The apparatus includes a chip board for holding and activating a plurality of semiconductor chips or components. A second heat sink board is provided which, when operably engaged with the chip board, has a metal heat plate in contact with each chip. In the preferred embodiment, each metal plate is spring-loaded against the integrated circuit, thereby assuring good thermal contract. Referring to FIG. 1, the posts that provide the relative position and the spacing of the heat sink board 12 and the chip board 11 is shown.

One of the problems with the chip board and the heat sink board combination is the length of time and inconvenience to remove a chip board, thus, chip board has been replaced with a chip having unprocessed integrated circuits.

A need has therefore been felt for apparatus and an associated method having the feature of providing an improved structure for burn-in testing of semiconductor chips. It would be yet another feature of the apparatus and associated method to provide for a quick attachment and detachment of a heat sink board and a chip testing board. It would be a still further feature of the present invention to provide for a quick coupling and decoupling of heat sink board.

SUMMARY OF THE INVENTION

The foregoing and other features are accomplished, according to the present invention, by providing a post that is divided into two sections, a top post and a base post that are attached by a clip. Shown in FIG. 1 and FIG. 1A, is a chip board/heat sink board 10. The clip 13 is attached to the same board as the base post 11. The top post has a notch 14 surrounding the top post and a tapered end 15. The tapered end 15 of the top post permits the top post, when inserted into the base post cavity and through an aperture in the clip 13, to force the top surface of the clip aside. The bottom surface of the clip 13 is attached to the same board as the base post. The side surface of the clip 13 acts as a spring forcing the top of the clip into an aperture in the base post that extends into the cavity of the base post. Heat sink board and the chip board are to be coupled; the top posts are inserted into the cavities base posts. The tapered portion of the top post pushes the top surface to the clip aside. Because of the spring-loading between the heat sinks and the chips, pressure will need to be applied. When the top post is sufficiently in the cavity of the base post, the spring action of the clip 13 will force and edge the aperture of the clip 13 into the notch in the top post, thereby securing the heat sink board and the chip board in a predetermined relative position. To separate the two boards, pressure on the side surface of the chip will force the side of the top surface clip aperture out of the notch in the top post and because of the spring-loading, the boards will separate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 and FIG. 1A are perspective view of the prior art chip board/heat sink board configuration illustrating the posts that position and space the two boards;

FIG. 2 is a side view of the top post according to the present invention;

DETAILED DESCRIPTION

Figure 3:
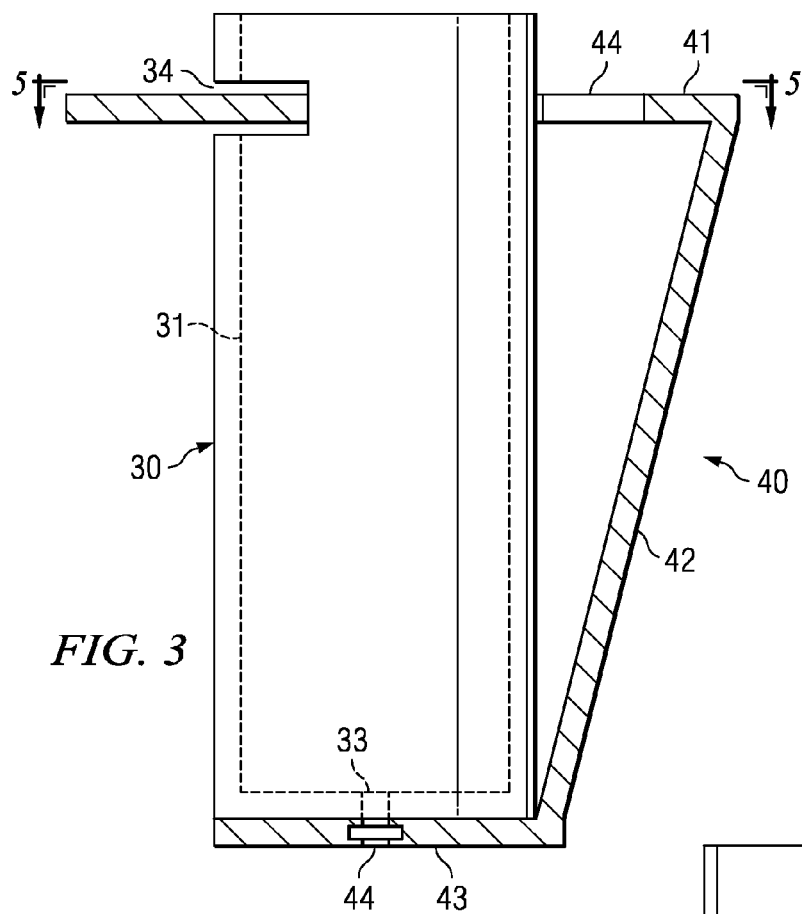
FIG. 3 is a side view of the base post and clip according to the present invention.
Figure 4:
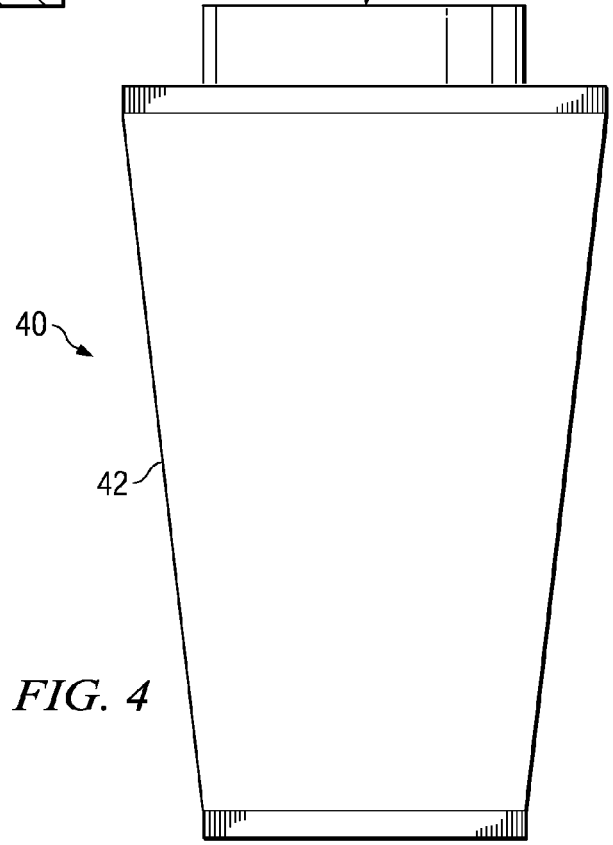
FIG. 4 is a back view of the clip according to the present invention.
Figure 6:
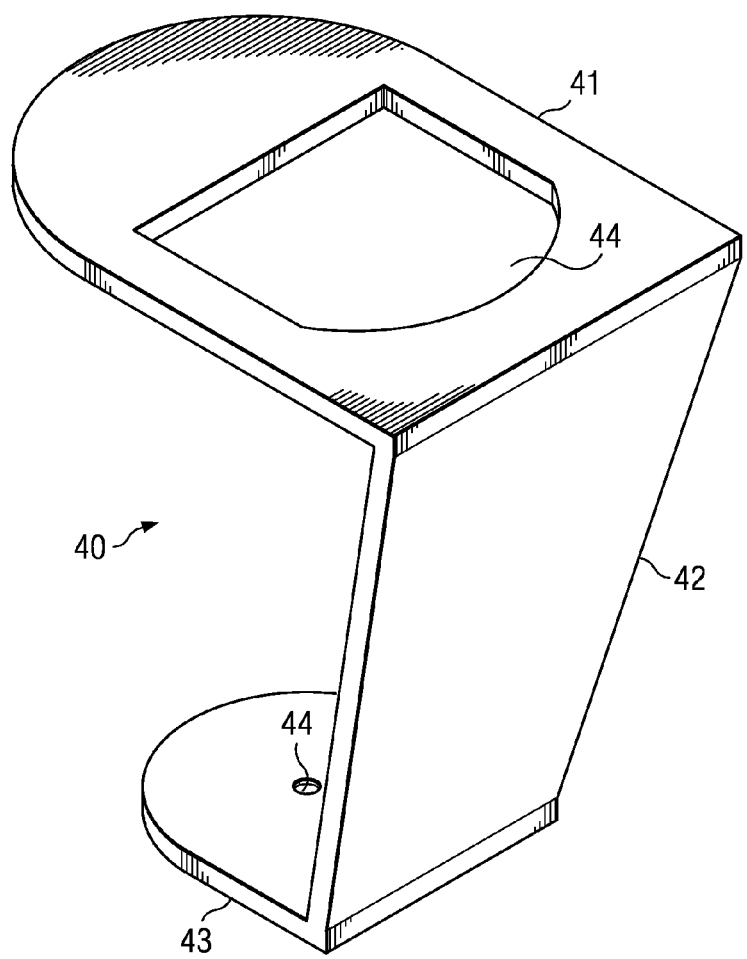
FIG. 6 is a perspective view of the clip according to the present invention.
Figure 5:
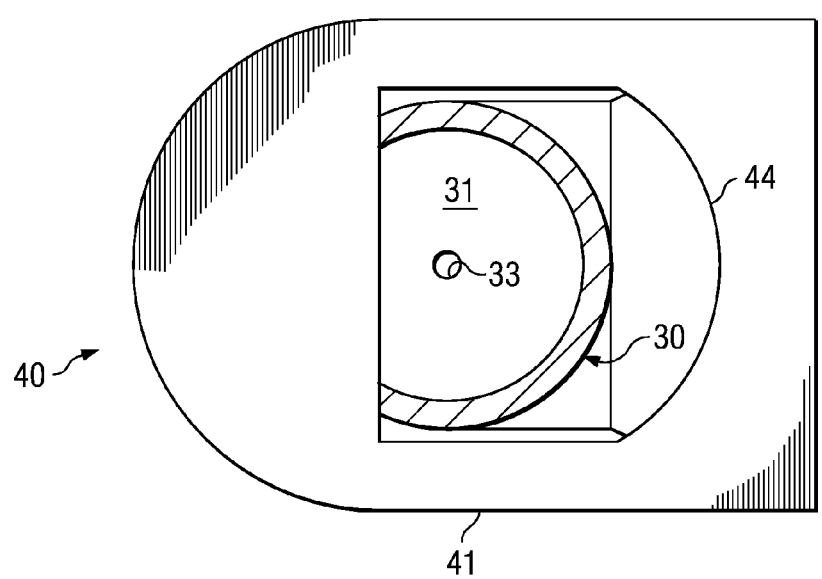
FIG. 5 is a top view of the clip according to the present invention.

Referring now to FIGS. 2, 3 and 4, these figures show the mechanism for coupling a chip board and a heat sink board according to the present invention. In cross-sectional view of FIG. 2, top post 20 includes generally cylindrical body 21, a notch 23 formed in and around the cylindrical body 21. The top post 20 also includes a tapered portion 24 on the end of the top post facing the chip board 11, while on the other end of the structure 22, for example a threaded cavity, provides the mechanism by which the top post is coupled to the heat sink board 12.

Referring to FIG. 3, a cross-sectional view of the base post 30 is shown. Base post 30 has a cylindrical structure that includes a cavity 31 into which the top post 20 is to be inserted when the chip board and the heat sink board are to be coupled. Base post 30 includes a structure 33 on the end proximate the chip board and is the structure that facilitates the coupling of the base post 30 to the chip board 11. Base post 30 also includes an aperture 34 that extends through the sides of the cylindrical body 30 extending into the cavity 31.

FIGS. 2, 3, 4 and 5 illustrate the structure of clip 4. In the bottom surface 42 of clip 4, an aperture 44 permits the mechanism for securing the base post 30 to the chip board 11 to simultaneously secure the clip 40 in place. The side member 43 of clip 40, connecting the lower member 43 with the upper member 41 acts as a spring. The upper member 41 of clip 40 has an aperture 44. When the clip 40 and the base post 30 are secured to the chip board 11, the base post 30 extends through the aperture 44 in the top member 41 of clip 40. The relative position of the clip 40 and the base member 30 causes the spring action of side member 42 to force the edge of aperture 44 of the clip to be forced through aperture 34 in the base post 30 and into the cavity 31 of base post 30. The top post 20 can then be inserted into the cavity of base post 30.

When the top post is inserted into the bottom post, the tapered geometry 24 of the top post forces the top member of clip 40 aside. When the top post 20 has penetrated the cavity of the bottom post to a sufficient extent, the notch 23 of the top post will be aligned with the top member 41 of the clip 40. The spring action of the clip 40 forces a portion of the clip aperture 44 into the notch 23 of the top post, thereby securing the relative relationship between the top post 20 and the base post 30. To disengage the top post 20 and the base post 30, pressure is applied to the side member 42 of clip 40, thereby forcing the side of the aperture 44 from contact with the notch of the top post. Because the heat sink elements of the heat sink board are in spring-loaded contact with the chips of the chip board, the disengagement of the clip 40 element from the top post will result in the heat sink board and the chip board being forced apart. Similarly, the spring-loading between the heat sink board and the chip board results in force being necessary to couple the boards.

The foregoing discussion describes how a heat sink board and a chip board can be easily coupled and uncoupled. As will be clear, the positions of the top post and the base post on the two boards can be reversed. The side member of the clip should be oriented to provide easy access, particularly for uncoupling the two boards. The spring-loading of the heat sink components and the chip components provide that the uncoupling is relatively easy, requiring only a modest pressure on the side of the clip.

The dimensions of the posts and the clip are selected so that relationship between the heat sink board and the chip board is appropriate for the geometries of the two boards.

As will be clear, the clip requires resiliency to engage the notch of the top post. Therefore, the clip should be fabricated, at least in part, with a material providing spring-like properties.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A clip for coupling a first board and second board, the first board having at least one first post coupled thereto, the second board having at least one second post coupled thereto, each of the at least one second post being a cylinder for receiving at least one of the at least one first post, the first and second boards having a predetermined relative position when the at least one second post fully engages the at least one first post, each of the at least one second post having an aperture in a side exposing the interior of the cylinder, each of the at least one first post having a tapered end and a notch around the post, the clip comprising:

a base member, the base member being coupled to the second board;

a top member, the top member having an aperture therein; and a side member connecting the top member and the base member, the side member fabricated so that an edge of the aperture of the top member is forced through the aperture of the at least one second post into the interior of the at least one second post, the edge being forced into the notch when the at least one first and the at least one second post are engaged and the first and second boards are in the predetermined relative position, wherein of the at least one each second post comprises a hollow portion for receiving an associated one of the at least one first post when the boards are positioned in a predetermined alignment, each of the at least one second post having an aperture providing access to the hollow portion, and wherein, when the associated first post is received in the hollow portion of the associated second post, enters the aperture of the associated second post and engages the notch of the associated first post to couple the associated first post to the associated second post for securing each of the at least one first post and each of the at least one second post to said boards independently of said base and top members.

2. The clip as recited in claim 1, wherein the first and second boards are decoupled when pressure is applied to the side member.

3. The clip as recited in claim 2, wherein pressure on the side member removes the aperture edge from the notch.

4. The clip as recited in claim 3, wherein the first and the second boards are spring-loaded in the predetermined position.

5. The clip as recited in claim 1, wherein the first and second boards form a system for the burn-in of semiconductor components.

* * * * *